United States Patent
Bulatowicz (10) Patent No.: US 8,487,729 B2
(45) Date of Patent: Jul. 16, 2013

(54) MAGNETIC SOLENOID FOR GENERATING A SUBSTANTIALLY UNIFORM MAGNETIC FIELD

(75) Inventor: Michael D. Bulatowicz, Canoga Park, CA (US)

(73) Assignee: Northrop Grumman Guidance & Electronics, Woodland Hills, CA (US)

( * ) Notice: Subject to any disclaimer, the term of this patent is extended or adjusted under 35 U.S.C. 154(b) by 0 days.

(21) Appl. No.: 13/165,023

(22) Filed: Jun. 21, 2011

(65) Prior Publication Data

US 2011/0247414 A1 Oct. 13, 2011

Related U.S. Application Data

(63) Continuation-in-part of application No. 12/364,189, filed on Feb. 2, 2009, now Pat. No. 8,330,566.

(51) Int. Cl.
*H01F 5/00* (2006.01)
(52) U.S. Cl.
USPC .............................. 335/299; 355/220
(58) Field of Classification Search
USPC .. 335/216, 220–229, 296–299, 198; 600/410, 600/415
See application file for complete search history.

(56) References Cited

U.S. PATENT DOCUMENTS

| | | | |
|---|---|---|---|
| 2,159,537 A | 5/1939 | Ruska | |
| 2,438,985 A | 4/1948 | Ambrose | |
| 4,412,195 A | 10/1983 | Kuroda | |
| 4,617,516 A * | 10/1986 | Schenck | 324/318 |
| 4,651,565 A | 3/1987 | Keene | |
| 5,117,188 A | 5/1992 | Ohkawa | |
| 5,289,129 A * | 2/1994 | Joseph | 324/318 |
| 5,289,151 A * | 2/1994 | Turner | 335/299 |
| 5,578,165 A | 11/1996 | Patrick et al. | |
| 5,799,653 A | 9/1998 | Carlson | |
| 5,818,226 A | 10/1998 | Aizawa | |
| 6,198,369 B1 | 3/2001 | Ward et al. | |
| 6,487,437 B1 | 11/2002 | Viswanathan et al. | |
| 2001/0004000 A1 | 6/2001 | Qian et al. | |
| 2003/0058077 A1 | 3/2003 | Hamer et al. | |
| 2005/0270131 A1 | 12/2005 | Hans et al. | |
| 2010/0194506 A1 | 8/2010 | Bulatowicz et al. | |

FOREIGN PATENT DOCUMENTS

GB 2 306 007 A 4/1998

OTHER PUBLICATIONS

International Search Report for corresponding PCT/US2010/022901, completed Mar. 3, 2010.

* cited by examiner

*Primary Examiner* — Bernard Rojas
(74) *Attorney, Agent, or Firm* — Tarolli, Sundheim, Covell & Tummino LLP (57) ABSTRACT

One embodiment of the invention includes a magnetic solenoid. The magnetic solenoid includes an elongated sidewall that extends along and surrounds a central axis between spaced apart ends. The central axis can include a center point that is approximately equidistant from the spaced apart ends. The magnetic solenoid also includes a conductive coil that extends along and conforms to the elongated sidewall and comprises a plurality of consecutive loops centered on the central axis. The plurality of consecutive loops can have a consecutive loop-spacing that is non-uniform along the central axis and having a substantial maximum spacing value at approximately the center point.

19 Claims, 7 Drawing Sheets

MAGNETIC SOLENOID FOR GENERATING A SUBSTANTIALLY UNIFORM MAGNETIC FIELD

CROSS REFERENCE TO RELATED APPLICATIONS

The present invention is a continuation-in-part application that claims priority to U.S. patent application Ser. No. 12/364,189, filed on Feb. 2, 2009 now U.S. Pat. No. 8,330,566.

TECHNICAL FIELD

The present invention relates generally to magnetic device systems, and specifically to a magnetic solenoid for generating a substantially uniform magnetic field.

BACKGROUND

Magnetic solenoids can be implemented for a variety of applications to generate a magnetic field, such as in an inner volume of the magnetic solenoid. As an example, magnetic solenoids can be implemented to generate a magnetic field for a gyroscope, such as a nuclear magnetic resonance (NMR) gyroscope that is located within the inner volume of the magnetic solenoid, to induce precession of noble gas isotopes. As an example, magnetic solenoids can be formed of a conductive coil that is configured with a cylindrical geometry. Depending on the application for which the magnetic solenoid is intended, such as in an NMR gyroscope application, it may be desirable to generate a magnetic field that is substantially uniform throughout the inner volume of the magnetic solenoid. However, a cylindrical configuration of the conductive coil can result in an unacceptable non-uniformity of the magnetic field, such as near the ends of the cylindrical configuration and at points that are off-axis from a central axis of the cylindrical configuration.

SUMMARY

One embodiment of the invention includes a magnetic solenoid. The magnetic solenoid includes an elongated sidewall that extends between spaced apart ends. The elongated sidewall can surround a central axis that extends longitudinally along the sidewall. The elongated sidewall can have a radius that is defined by a compound equation that varies the radius as a function of position along the central axis.

Another embodiment of the invention includes a magnetic solenoid. The magnetic solenoid includes an elongated sidewall that extends between spaced apart ends. The elongated sidewall can surround a central axis that extends longitudinally along the sidewall. The elongated sidewall can have a radius that is defined by a compound equation having a first operand that affects along-axis uniformity of a substantially uniform magnetic field and a second operand that affects off-axis uniformity of the substantially uniform magnetic field, such that the substantially uniform magnetic field has a substantially uniform magnitude and direction with respect to each point in three-dimensional space within an inner volume that is enclosed by the conductor coil.

Yet another embodiment of the invention includes a magnetic solenoid that is configured to provide a substantially uniform magnetic field in an inner volume that is enclosed by the magnetic solenoid. The magnetic solenoid includes a central portion in which a radius of the magnetic solenoid about a central axis is substantially elliptical. An elliptical minor axis occupies a plane that is normal to the central axis. The magnetic solenoid also includes first and second end portions opposite each other in which the radius of the conductor coil flares outward from the central axis.

Yet a further embodiment of the invention includes a magnetic solenoid. The magnetic solenoid includes an elongated sidewall that extends along and surrounds a central axis between spaced apart ends. The central axis can include a center point that is approximately equidistant from the spaced apart ends. The magnetic solenoid also includes a conductive coil that extends along and conforms to the elongated sidewall and comprises a plurality of consecutive loops centered on the central axis. The plurality of consecutive loops can have a consecutive loop-spacing that is non-uniform along the central axis and having a substantial maximum spacing value at approximately the center point.

Another further embodiment of the invention includes a magnetic solenoid. The magnetic solenoid includes an elongated sidewall that extends along and surrounds a central axis between spaced apart ends. The central axis can include a center point that is approximately equidistant from the spaced apart ends. The magnetic solenoid also includes a conductive coil that extends along and conforms to the elongated sidewall and comprises a plurality of consecutive loops centered on the central axis. The plurality of consecutive loops can have a consecutive loop-spacing that is non-uniform along the central axis. The consecutive loop-spacing can be substantially symmetrical about the center point of the central axis and having a substantial maximum spacing value at approximately the center point and substantial minimum spacing values at approximately the spaced apart ends, such that the magnetic solenoid is configured to generate a substantially uniform magnetic field with respect to each point in three-dimensional space within an inner volume of the magnetic solenoid based at least in part on the consecutive loop-spacing.

Yet another further embodiment of the invention includes an elongated sidewall that extends along and surrounds a central axis between spaced apart ends, the central axis comprising a center point that is approximately equidistant from the spaced apart ends. The elongated sidewall can have a radius that is defined by a compound equation that varies the radius as a function of position along the central axis. The magnetic solenoid also includes a conductive coil that extends along and conforms to the elongated sidewall and comprises a plurality of consecutive loops centered on the central axis. The plurality of consecutive loops can have a consecutive loop-spacing that is non-uniform along the central axis and can have a substantial maximum spacing value at approximately the center point. The magnetic solenoid can be configured to generate a substantially uniform magnetic field with respect to each point in three-dimensional space within an inner volume of the magnetic solenoid based on the consecutive loop-spacing and the geometry of the elongated sidewall.

DETAILED DESCRIPTION

The present invention relates generally to magnetic device systems, and specifically to a magnetic solenoid for generating a substantially uniform magnetic field. The magnetic solenoid can include a conductive coil that has a radius about a central axis that is defined by a compound equation at each point along the central axis. As an example, the compound equation can have a first operand that can be an elliptical or circular function having a minor axis that defines the radius of the conductive coil at a midpoint of the magnetic solenoid along the central axis. The first operand can define a rounded center portion of the magnetic solenoid having a variable radius of the conductive coil along the length, with the radius having a maximum value at the midpoint of the magnetic solenoid along the central axis. The first operand can thus be effective in its dominant effect to provide along-axis uniformity of the magnetic field within the inner volume of the magnetic solenoid. The compound equation can also have a second operand that can be, for example, one of an exponential, parabolic, or hyperbolic function. The second operand can define a flaring of the radius of the conductive coil away from the central axis at each end of the magnetic solenoid. The second operand can thus be effective in its dominant effect to provide off-axis uniformity of the magnetic field within the inner volume of the magnetic solenoid. The magnetic solenoid can thus be substantially symmetrical about a plane at the midpoint of the magnetic solenoid along the central axis.

As another example, the compound equation can have three operands. The first operand can define a radius at the midpoint of the magnetic solenoid along the central axis. The second and third operands can each be exponential functions. The second and third operands can each include pre-selected constants and can have magnitudes that vary as a function of distance from the midpoint of the magnetic solenoid along the central axis. As an example, the second operand can be subtracted from the first operand and the third operand can be added to the first operand. Therefore, the second and third operands can be selected to vary the radius along the central axis to define a rounded center portion of the magnetic solenoid having a variable radius of the conductive coil along the length and to define a flaring of the radius of the conductive coil away from the central axis at each end of the magnetic solenoid.

As yet another example, the magnetic solenoid can have a conductive coil that extends along and conforms to the sidewall and comprises a plurality of consecutive loops centered on the central axis. The consecutive loops can have a consecutive loop-spacing that is non-uniform along the central axis and can have a maximum spacing value at approximately the center point. For example, the consecutive loop-spacing can be symmetrical about the center point with respect to the length of the magnetic solenoid. As a result of the non-uniform loop-spacing of the magnetic solenoid, the magnetic solenoid can have a substantially uniform magnetic field within the inner volume of the elongated sidewall. In addition, the magnetic solenoid can incorporate both the variable radius along the length of the solenoid and the non-uniform loop-spacing to achieve the substantially uniform magnetic field within the inner volume.

Figure 1:
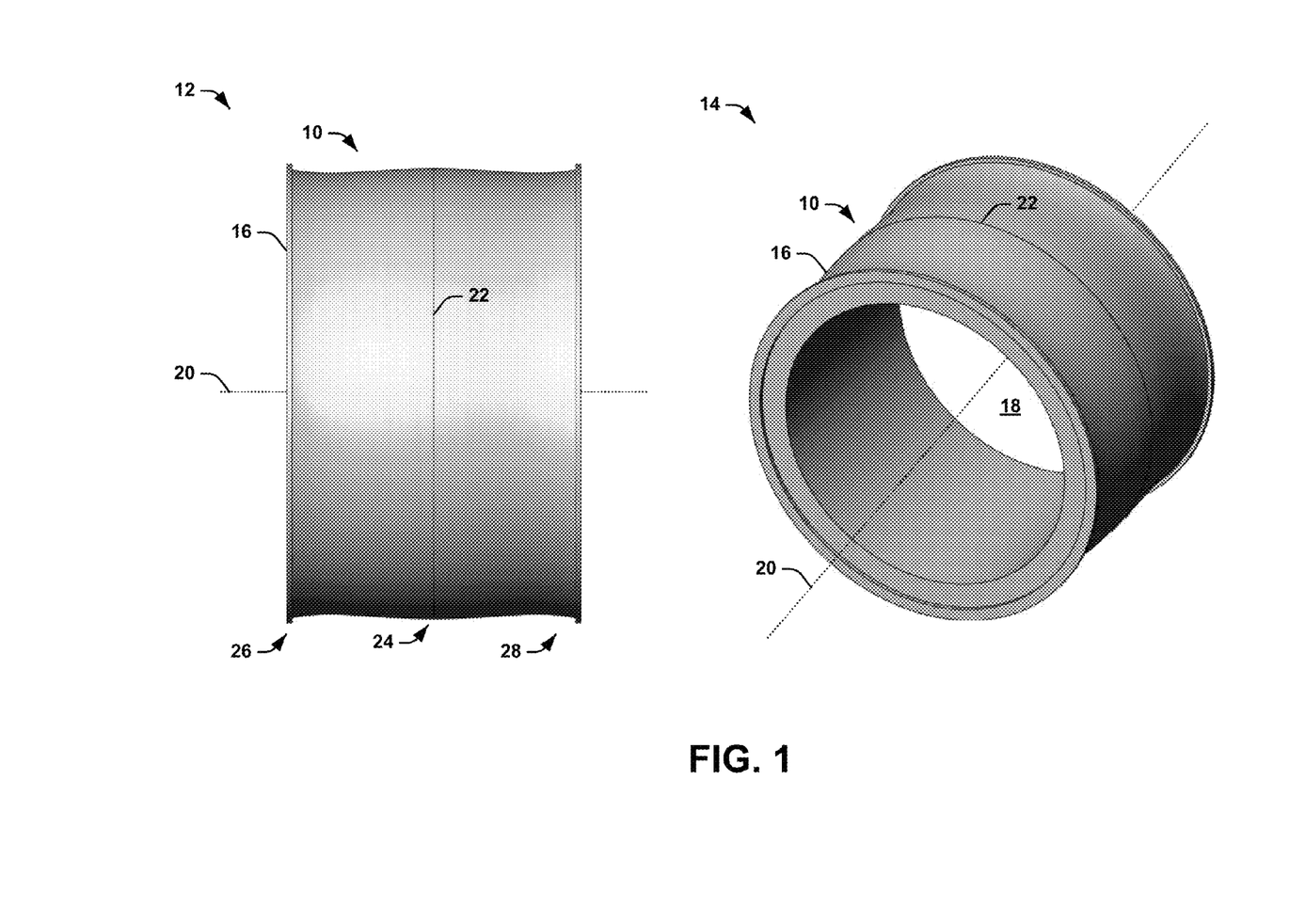
FIG. 1 illustrates an example of a perspective view of a magnetic solenoid in accordance with an aspect of the invention.

FIG. 1 illustrates an example of a perspective view of a magnetic solenoid 10 in accordance with an aspect of the invention. As an example, the magnetic solenoid 10 can be implemented in any of a variety of applications that utilize a magnetic field, such as in a nuclear magnetic resonance (NMR) gyroscope application. In the example of FIG. 1, the magnetic solenoid 10 is demonstrated in a side view 12 and in an isometric view 14. The magnetic solenoid 10 includes a coil form 16, around which is wound a conductive coil (not shown) that is configured to generate a substantially uniform magnetic field within an inner volume 18 of the magnetic solenoid 10. As an example, the coil form 16 can be encased in a magnetic shielding material (not shown) which serves to improve the field uniformity. For example, the magnetic shielding material can decrease the field fluctuations caused by external fields, such as the natural magnetic field of Earth or from artificial sources. As another example, a well designed and constructed high-permeability magnetic shield can, through reflective image fields, significantly enhance the uniformity of the magnetic field generated by the magnetic solenoid 10. The conductive coil can have a radius about a central axis 20 that conforms to an outer-diameter (OD) of the coil form 16. Therefore, the magnetic field that is generated within the inner volume 18 has a magnitude that is substantially uniform at each point within the inner volume 18 based on the radius of the conductive coil around the coil form 16.

The radius of the conductive coil can be defined by a compound equation at each point along the central axis 20 within the inner volume 18 of the magnetic solenoid 10. As described herein, a compound equation is defined as an equation having a solution that is defined by two or more operands that each includes at least one variable. Thus, because the compound equation defines the radius at each point along the central axis 20 within the inner volume 18 of the magnetic solenoid 10, each operand of the compound equation includes a variable that is the location of each point along the central axis 20 within the inner volume 18 of the magnetic solenoid 10.

As an example, a first operand of the compound equation can be a circular or an elliptical function having a minor axis that defines the radius of the conductive coil at a midpoint of the magnetic solenoid along the central axis 20. A second operand of the compound equation can be an exponential, parabolic, or hyperbolic function that defines a flaring of the radius of the conductive coil away from the central axis 20 at each end of the magnetic solenoid 10. As another example, a first operand of the compound equation can define a radius at the midpoint of the magnetic solenoid 10 along the central axis 20. A second and third operand of the compound equation can be exponential functions that vary as a function of distance from the midpoint of the magnetic solenoid 10 along the central axis 20, such as to have counteracting additive and subtractive effects.

As an example, the compound equation that defines the radius R of the conductive coil can be expressed as R=(First Operand)+(Second Operand). Specifically, one example of the compound equation can be expressed as follows:

$$R = \frac{\sqrt{\left[ MinorAxis^2 * \left[ 1 - \frac{(z - \text{Midpoint})^2}{MajorAxis^2} \right] \right]}}{2} + \frac{(|Z - \text{Midpoint}| * A)^C}{B}$$

Equation 1

Where
- MinorAxis is a minor axis dimension of the elliptical portion of the compound equation;
- MajorAxis is a major axis dimension of the elliptical portion of the compound equation;
- Z is a distance along the central axis 20 relative to a first end of the magnetic solenoid 10;
- Midpoint is a distance along the central axis 20 from the first end of the magnetic solenoid 10 to the midpoint of the magnetic solenoid 10 along the central axis 20; and
- A, B, and C are constants defining the exponential portion of the compound equation.

Thus, the first operand is demonstrated in Equation 1 as corresponding to the elliptical function and the second operand is demonstrated in Equation 1 as corresponding to the exponential function. It is to be understood that the magnitudes of the constants MinorAxis, MajorAxis, A, B, and C can be set to achieve desired dimensional and magnetic field characteristics of the magnetic solenoid 10.

In the example of FIG. 1, the magnetic solenoid 10 is demonstrated as substantially symmetrical about a plane at a midpoint of the magnetic solenoid 10 along the central axis 20, as demonstrated by the line 22 around the periphery of the magnetic solenoid 10. The magnetic solenoid 10 includes a central portion 24, a first end portion 26, and a second end portion 28 that is opposite the first end portion 26. In the example of FIG. 1, the radius of the conductive coil in the central portion 24 can be largely dominated by the first operand of Equation 1. Therefore, the radius of the conductive coil in the central portion 24 is substantially elliptical, such that the minor axis of the defined ellipse is coplanar with the plane of symmetry 22. Thus, in each direction along the central axis 20 away from the plane of symmetry 22, the radius of the conductive coil slopes inward toward the central axis 20 in the central portion 24. In each of the end portions 26 and 28, the radius of the conductive coil is largely dominated by the second operand of Equation 1. Therefore, the radius of the conductive coil flares radially outward from the central axis 20 at points along the central axis 20 away from the plane of symmetry 22 in the first and second end portions 26 and 28.

The first operand of Equation 1 (i.e., the elliptical function) can be set to provide a substantially uniform along-axis magnitude of the magnetic field within the inner volume 18 of the magnetic solenoid 10. Specifically, the magnetic field within the inner volume 18 of the magnetic solenoid 10 can be substantially uniform along the central axis 20 based on the characteristics (e.g., MajorAxis and MinorAxis) of the first operand of Equation 1. In addition, the characteristics (e.g., MajorAxis and MinorAxis) of the first operand of Equation 1 can also be set to define the physical dimensions (i.e., length and width) of the magnetic solenoid 10. Conversely, the second operand of Equation 1 (i.e., the exponential function) can be set to provide a substantially uniform off-axis magnitude of the magnetic field within the inner volume 18 of the magnetic solenoid 10. Specifically, the magnetic field within the inner volume 18 of the magnetic solenoid 10 can be substantially uniform at points in three-dimensional space that are radially separated from the central axis 20 relative to the magnitude of the magnetic field at the central axis 20 based on the characteristics (e.g., constants A, B, and C) of the second operand of Equation 1. As an example, the constant C can be an even number to set the second operand as an even-order polynomial, can be an odd number to set the second operand as an odd-order polynomial, or can be any number, such as including a fractional magnitude.

As a result of the geometry of the conductive coil of the magnetic solenoid 10, the magnetic solenoid 10 can be implemented to effectively provide a substantially uniform magnetic field within the inner volume 18 of the magnetic solenoid 10 for a variety of applications. As an example, the magnetic solenoid 10 can achieve a magnetic field uniformity of better than five parts per million in a spherical volume with a radius equal to approximately one-eighth of a corresponding cylindrical radius and with a coil length-to-diameter ratio of approximately 7:11 as calculated for magnetic field coil behavior inside magnetic shielding, such as that described above. As another example, the magnetic solenoid 10 can achieve a magnetic field uniformity of better than one part per million in a spherical volume with a radius equal to approximately one-eighth of a corresponding cylindrical radius, and with a coil length-to-diameter ratio of approximately 14:15 as calculated for magnetic field coil behavior inside magnetic shielding, such as that described above.

In addition, the geometry of the conductive coil can be such that the magnetic solenoid 10 can be manufactured at a significantly smaller size relative to conventional magnetic solenoids. Specifically, conventional magnetic solenoids can typically be required to be manufactured at a significantly greater length to achieve similar magnetic field uniformity. As an example, the magnetic solenoid 10 can be manufactured at less than 10 millimeters and still achieve a substantially uniform magnetic field within the inner volume 18. By comparison, a conventional strictly cylindrical solenoid with an identical maximum radius would need to be approximately 70 mm in length to achieve substantially the same on-axis field uniformity in the same test volume while enclosed in similar shielding. Furthermore, conventional magnetic solenoids that do not implement a cylindrical geometry (e.g., having an elliptical geometry) can have a constricted radius, such as at one or both ends, such that the size of an object which can be inserted into the inner volume of the conventional magnetic solenoid can be restrictive. However, the magnetic solenoid 10 can be designed to have only minor deviations in radius to still achieve the substantial uniformity in the magnetic field in the inner volume 18. As an example, an object inserted into the inner volume 18 of the magnetic solenoid 10 may only be reduced in size by approximately 4% relative to an object that can be inserted into a cylinder having a radius approximately equal to the maximum radius of the magnetic solenoid 10. Accordingly, the magnetic solenoid 10 can be smaller and more versatile in application than conventional magnetic solenoids.

Figure 2:
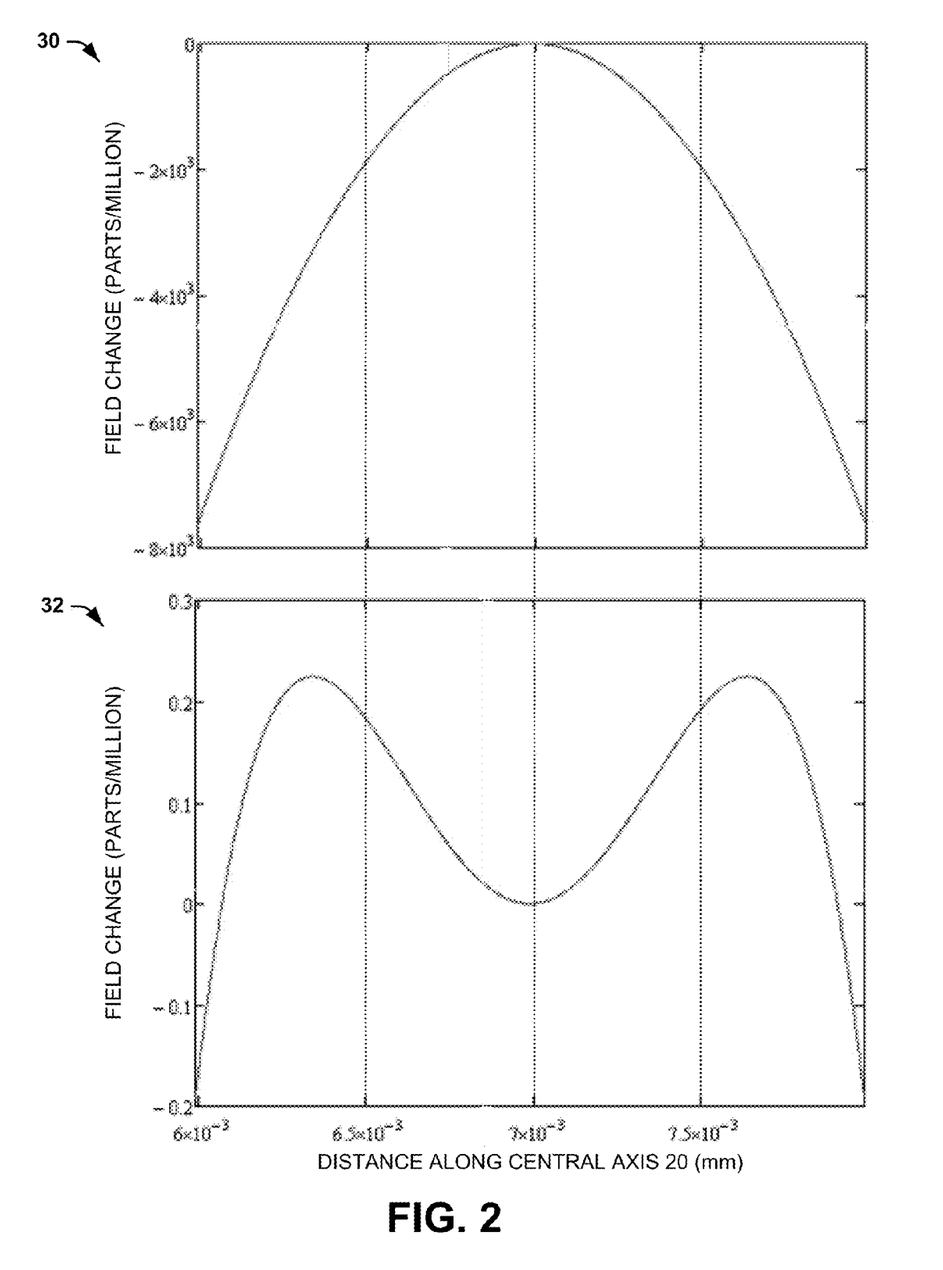
FIG. 2 illustrates an example of graphs demonstrating along-axis magnetic field in accordance with an aspect of the invention.
Figure 3:
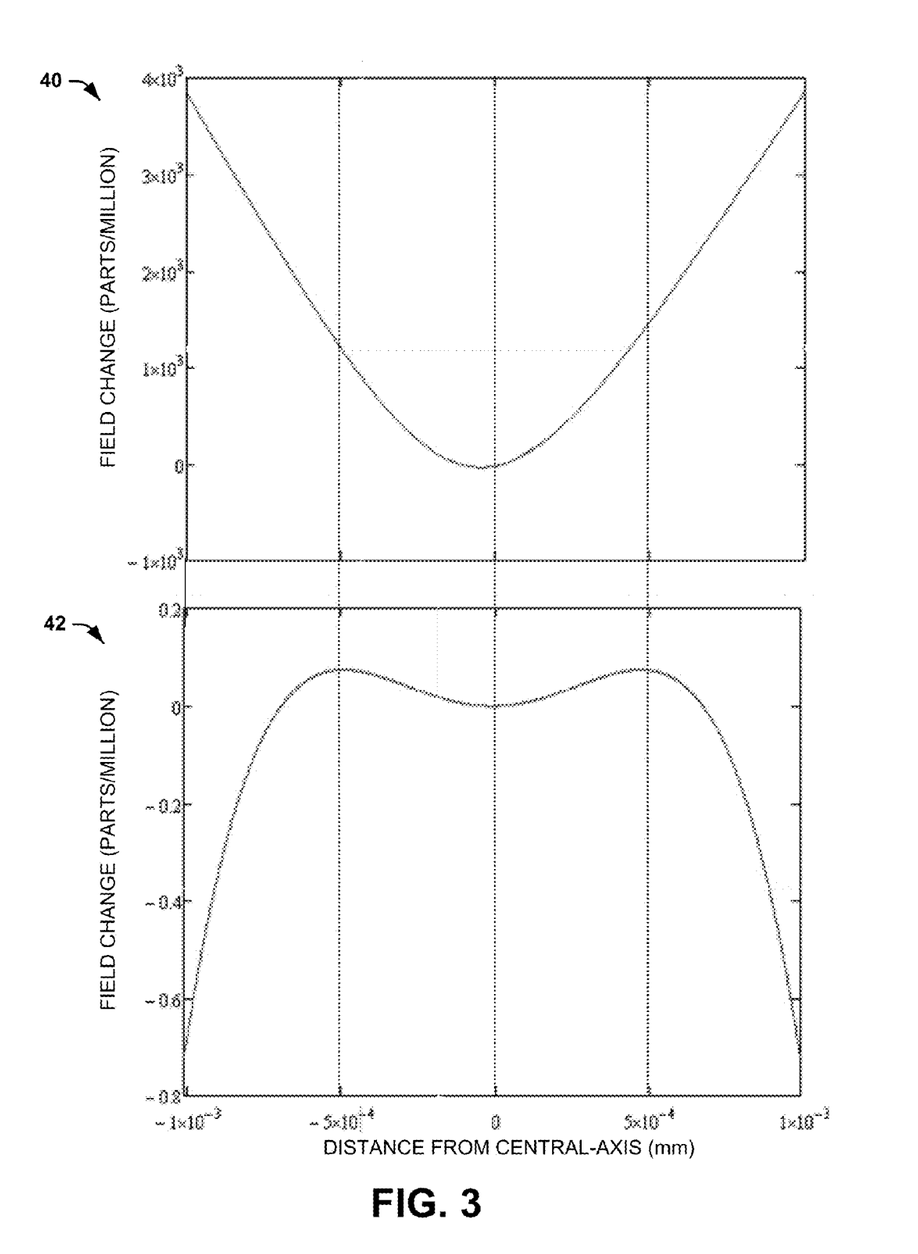
FIG. 3 illustrates an example of graphs demonstrating off-axis magnetic field in accordance with an aspect of the invention.

FIG. 2 illustrates an example of graphs 30 and 32 demonstrating along-axis magnetic field in accordance with an aspect of the invention. FIG. 3 illustrates an example of graphs 40 and 42 demonstrating off-axis magnetic field in accordance with an aspect of the invention. In the example of FIGS. 2 and 3, the graphs 30 and 40 can correspond to a typical, substantially cylindrical magnetic solenoid having a coil radius of approximately 7.5 mm and a coil length of approximately 14 mm. The graphs 32 and 42 can correspond to the magnetic solenoid 10 in the example of FIG. 1, such as based on Equation 1, having substantially similar dimensions as the typical, substantially cylindrical magnetic solenoid.

For example, the magnetic solenoid 10 can have a MinorAxis value of approximately 7.5 mm, a MajorAxis value of approximately 34 mm, a Midpoint value of approximately 7 mm, and values for the constants A, B, and C of approximately $10^3$, $10^8$, and 4, respectively.

For the graphs 30, 32, 40, and 42 in the examples of FIGS. 2 and 3, a test volume of an approximately 2 mm sphere centered at the midpoint of each of the magnetic solenoids is chosen. The graphs 30 and 32 plot changes in the magnetic field (Y-axis), in parts per million, versus distance along the central axis (X-axis) of the respective magnetic solenoids. Similarly, the graphs 40 and 42 plot changes in the magnetic field (Y-axis), in parts per million, versus transverse distance from the central axis (X-axis) of the respective magnetic solenoids.

As demonstrated by the graph 32, the magnetic solenoid 10 has significantly greater along-axis magnetic field uniformity than the typical, cylindrical magnetic solenoid demonstrated by the graph 30. Specifically, the graph 30 demonstrates variation in the along-axis magnetic field for the typical, substantially cylindrical magnetic solenoid of approximately 8000 parts per million relative to a variation of approximately 0.4 parts per million demonstrated by the graph 32 for the magnetic solenoid 10. Similarly, as demonstrated by the graph 42, the magnetic solenoid 10 has significantly greater off-axis magnetic field uniformity than the typical, cylindrical magnetic solenoid demonstrated by the graph 40. Specifically, the graph 40 demonstrates variation in the off-axis magnetic field for the typical, substantially cylindrical magnetic solenoid of approximately 4000 parts per million relative to a variation of approximately 0.8 parts per million demonstrated by the graph 42 for the magnetic solenoid 10.

Referring back to the example of FIG. 1, the compound equation that defines the radius of the conductive coil of the magnetic solenoid 10 is not limited to Equation 1. As an example, the compound equation that defines the radius R of the conductive coil can be expressed as R=(First Operand)−(Second Operand)+(Third Operand). Specifically, another example of the compound equation can be expressed as follows:

$$R = MidpointRadius - \frac{(|Z - Midpoint| * A)^B}{C} + \frac{(|Z - Midpoint| * D)^E}{F} \qquad \text{Equation 2}$$

Where
  MidpointRadius is a radius at the midpoint of the magnetic solenoid 10 along the central axis 20;
  Z is a distance along the central axis 20 relative to a first end of the magnetic solenoid 10;
  Midpoint is a distance along the central axis 20 from the first end of the magnetic solenoid 10 to the midpoint of the magnetic solenoid 10 along the central axis 20; and
  A, B, C, D, E, and F are constants defining the respective exponential portions of the compound equation.

Thus, the first operand is demonstrated in Equation 2 as corresponding to the radius at the midpoint of the magnetic solenoid 10 along the central axis 20, such that the first operand can define the greatest value of the radius at the central portion 24 of the magnetic solenoid 10. The second and third operands are demonstrated in Equation 2 as corresponding to exponential functions. As demonstrated in Equation 2, the second operand is subtracted from first operand and the third operand is added to the first and second operands.

Therefore, the second and third operands counteract to provide a varying value of the radius along the central axis 20 of the magnetic solenoid 10 from the midpoint to the respective first and second end portions 26 and 28. It is to be understood that the magnitudes of the constants A, B, C, D, E, and F can be set to achieve desired dimensional and magnetic field characteristics of the magnetic solenoid 10.

Based on the configuration of Equation 2, the first operand of Equation 2 can provide an initial radial value, and the second and third operands of Equation 2 can be defined (i.e., based on the constants A, B, C, D, E, and F) to provide substantially uniform along-axis and off-axis magnitudes of the magnetic field within the inner volume 18 of the magnetic solenoid 10. Specifically, the constants A, B, C, D, E, and F in the second and third operands, respectively, can define both a substantially rounded shape of the central portion 24 along the length of the magnetic solenoid to provide a substantially uniform magnitude of the magnetic field along the central axis 20. The second and third operands of Equation 2 can also be defined to provide a substantially uniform off-axis magnitude of the magnetic field within the inner volume 18 of the magnetic solenoid 10. Specifically, the constants A, B, C, D, E, and F in the second and third operands, respectively, can also define the substantially flared shape of the respective end portions 26 and 28. Accordingly, the compound equation can be expressed in any of a variety of ways to define the geometry of the conductive coil of the magnetic solenoid 10 to generate the substantially uniform magnetic field within the inner volume 18 of the magnetic solenoid 10.

Figure 4:
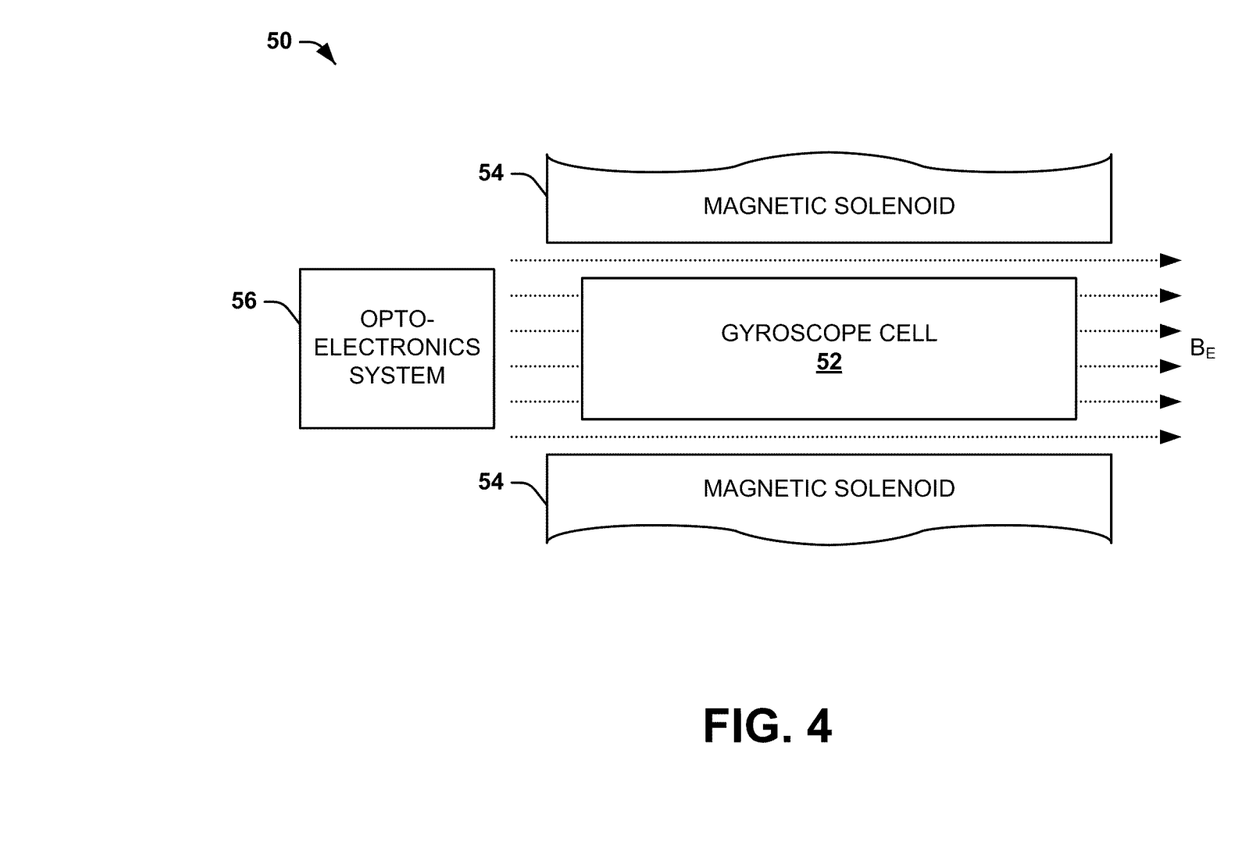
FIG. 4 illustrates an example of a gyroscope system in accordance with an aspect of the invention.

FIG. 4 illustrates an example of a gyroscope system 50 in accordance with an aspect of the invention. As an example, the gyroscope system 50 can be configured as a nuclear magnetic resonance (NMR) gyroscope system, such as to detect rotational motion about an axis. For example, the gyroscope system 50 can be one of a plurality of gyroscope systems, such as implemented in air or spacecraft, to detect yaw, pitch, and roll, respectively.

The gyroscope system 50 includes a gyroscope cell system 52. The gyroscope cell 52 can include a glass case that can be filled with, for example, an alkali metal vapor and/or at least one noble gas isotope. In the example of FIG. 4, the gyroscope cell 52 is substantially enclosed in an inner volume of a magnetic solenoid 54. As an example, the magnetic solenoid 54 can be configured substantially similar to the magnetic solenoid 10 in the example of FIG. 1. Specifically, the magnetic solenoid 54 can have a radius about a central axis that is defined by a compound equation, such as Equation 1 that includes a first operand that is a substantially circular or elliptical function and a second operand that is an exponential function (e.g., a polynomial), or such as Equation 2 that includes a first operand that defines the radius at the center of the magnetic solenoid 54 and second and third operands that are each exponential functions. Therefore, the magnetic solenoid 54 can be configured to generate a substantially uniform magnetic field $B_E$ throughout the inner volume of the magnetic solenoid 54.

In response to the substantially uniform magnetic field $B_E$, the alkali metal vapor and the noble gas isotope(s), in the gyroscope cell 52 can precess relative to the axis of the gyroscope cell 52. The gyroscope system 50 also includes an opto-electronics system 56. The opto-electronics system 56 can be configured to optically pump the alkali metal vapor in the gyroscope cell 52 to align the spin of the alkali metal vapor with the applied magnetic field. In response, due to a spin-exchange process, any noble gas isotopes also present in the cell are also spin-aligned to the pump light beam. A detection beam of light with a directional component normal to the pump direction can be modulated in response to the alignment of the alkali metal vapor relative to the detection light. The modulation of the detection light can be a function of the precession of the alkali metal vapor as modified by the precession of any noble gas isotopes present. This modulation can be detected by a photodetector, such as included in the opto-electronics system 56. Accordingly, changes in the precession rates of the alkali metal vapor, and by extension any noble gas isotopes present, as detected by the modulated optical signal, can be detected and processed to determine changes in the orientation of the gyroscope cell 52 that correspond to rotational motion.

It is to be understood that the gyroscope system 50 is demonstrated simplistically. As such, additional components and details have been omitted from the example of FIG. 4 and the associated description. In addition, it is also to be understood that a magnetic solenoid such as the magnetic solenoid 10 in the example of FIG. 1 is not intended to be limited to use in a gyroscope system, such as the gyroscope system 50 in the example of FIG. 4. Therefore, the magnetic solenoid 10 can be implemented in any of a variety of applications that may require a magnetic field, particularly a substantially uniform magnetic field.

Figure 5:
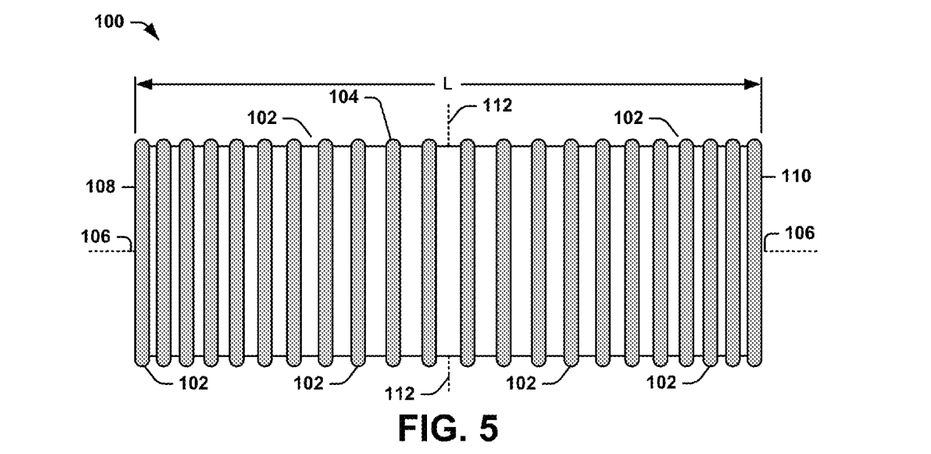
FIG. 5 illustrates an example of a diagram view of a magnetic solenoid in accordance with an aspect of the invention.

FIG. 5 illustrates an example of a diagram view of a magnetic solenoid 100 in accordance with an aspect of the invention. As an example, the magnetic solenoid 100 can be implemented in any of a variety of applications that utilize a magnetic field, such as in an NMR gyroscope application. In the example of FIG. 5, the magnetic solenoid 100 is demonstrated in a side view and includes a conductive coil 102 that is wound around a substantially cylindrical coil form 104 and is centered on a central axis 106. It is to be understood that, in the example of FIG. 5, the conductive coil 102 is illustrated in an exaggerated manner for ease in demonstration.

The magnetic solenoid 100 is configured to generate a substantially uniform magnetic field within an inner volume of the magnetic solenoid 100. The conductive coil 102 can have a loop-spacing that is non-uniform along a length L of the magnetic solenoid 100 between a first end 108 and a second end 110. In the example of FIG. 5, the loop-spacing of the conductive coil 102 has a substantially maximum value at an approximate center point of the central axis 106 along the length L of the magnetic solenoid 100 (i.e., approximately L/2), with the location of the center point being demonstrated based on an intersecting axis 112. The loop-spacing can thus decrease in value away from the center point, with substantially minimum values at each of the first and second ends 108 and 110. In the example of FIG. 5, the loop-spacing is substantially symmetrical about the intersecting axis 112 with respect to the first and second ends 108 and 110.

The loop-spacing of the conductive coil 102 can be defined by an equation, such that the loop-spacing is non-uniform with respect to consecutive loops of the conductive coil 102. As an example, for a given loop number D of the conductive coil 102, the spacing of the conductive coil 102 can be defined as follows:

$$Zc = \frac{\frac{|D|}{D} * \text{Length}}{2} * \frac{(D^2)^{1/E}}{\left(\left(\frac{N-1}{2}\right)^2\right)^{1/E}} \quad \text{Equation 3}$$

Where

Zc is a distance from the intersecting axis 112 to a given loop along the central axis;

Length is a total length L of the magnetic solenoid 100 between the first and second ends 108 and 110;

N is a total quantity of loops of the conductive coil 102;

E is a constant defining exponential terms of Equation 3; and

D is a loop number associated with the given one of the plurality of consecutive loops, defined by steps of one unit from $$-\left(\frac{N-1}{2}\right) \text{ to } \left(\frac{N-1}{2}\right).$$

Therefore, the distance of a given loop can be defined relative to the intersecting axis 112 based on Equation 3. Therefore, Equation 3 can define the loop-spacing for each of the loops of the conductive coil 102, such as to optimize the uniformity of the magnetic field within an inner volume of the magnetic solenoid.

As a result of the geometry of the conductive coil of the magnetic solenoid 100, the magnetic solenoid 100 can be implemented to effectively provide a substantially uniform magnetic field within the inner volume of the magnetic solenoid 100 for a variety of applications. As an example, the magnetic solenoid 100 can achieve a magnetic field uniformity that is much better than typical magnetic solenoids, including those having a typical Helmholtz configuration, such as by better than ten parts per million. In addition, the loop-spacing of the conductive coil 102 can be such that the magnetic solenoid 100 can be manufactured at a significantly smaller size relative to conventional magnetic solenoids. Furthermore, based on the non-uniformity of the loop-spacing, the coil form 104 of the magnetic solenoid 100 can include features not typically implemented by typical magnetic solenoids.

Figure 6:
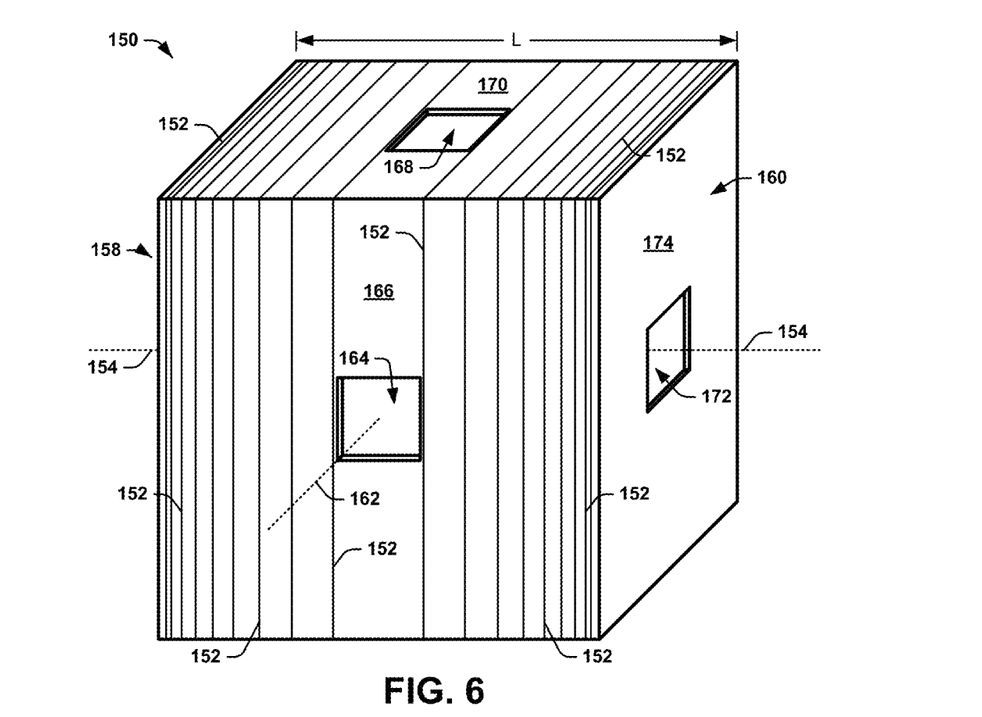
FIG. 6 illustrates yet another example of a magnetic solenoid in accordance with an aspect of the invention.

FIG. 6 illustrates yet another example of a magnetic solenoid 150 in accordance with an aspect of the invention. The magnetic solenoid 150 is demonstrated in a plan view in the example of FIG. 6, and includes a conductive coil 152 that is wound around a substantially cubical coil form 154 and is centered on a central axis 156. Similar to as described above in the example of FIG. 5, the conductive coil 152 is configured to generate a substantially uniform magnetic field within an inner volume of the magnetic solenoid 150 based on having a loop-spacing that is non-uniform along a length L of the magnetic solenoid 150 between a first end 158 and a second end 160. In the example of FIG. 6, the substantially cubical coil form 154 is demonstrated as being substantially enclosed, including at each of the first and second ends 160.

Similar to as described above in the example of FIG. 5, the loop-spacing of the conductive coil 152 has a substantially maximum value at an approximate center point of the central axis 156 along the length L of the magnetic solenoid 150 (i.e., approximately L/2), with the location of the center point being demonstrated based on an intersecting axis 162 and with the loop-spacing decreasing in value away from the center point toward the first and second ends 108 and 110. Based on the substantially maximum value of the loop-spacing of the conductive coil 152 being located along the approximate center point of the central axis, the conductive coil form 154 includes a plurality of holes. In the example of FIG. 6, a first hole 164 is located on a first side surface 166, a second hole 168 is located on a top surface 170, and a third hole 172 is located on a surface 174 associated with the second end 160.

The first and second holes 164 and 168 are thus demonstrated as being located between two consecutive loops of the conductive coil 152. In the example of FIG. 6, the two consecutive loops of the conductive coil 152 between which the first and second holes 164 and 168 are located correspond to those having a greatest consecutive loop-spacing with respect to each other. As a result, the dimensions of the first and second holes 164 and 168 can be substantially maximized while still being unoccluded by the conductive coil 152. The first and second holes 164 and 168, as well as the third hole 172, can be useful for a variety of reasons, such as to gain access to one or more devices within the inner volume of the magnetic solenoid 150 (e.g., an NMR gyroscope) without having to remove the one or more devices from the coil form 154. Such access can thus be granted while still maintaining a substantially rigid structure of the magnetic solenoid 150, while substantially mitigating reassembly and assembly time, and while generating a substantially improved uniform magnetic field over typical magnetic solenoids, including a typical Helmholtz magnetic solenoid.

It is to be understood that the magnetic solenoid 150 is not intended to be limited to the example of FIG. 6. As an example, while the magnetic solenoid 150 is demonstrated as having three holes, it is to be understood that the magnetic solenoid 150 could include additional holes, such as one on each surface of the substantially cubical coil form 154. In addition, the holes that are demonstrated are not limited to having a square geometry, but could instead have any of a variety of geometries. Furthermore, the coil form 154 is not limited to having a substantially cubical geometry, but could have a variety of geometries, such as cylindrical or parallelepiped. As yet another example, the magnetic solenoid 150 is not limited to having a non-uniform consecutive loop spacing, but may in addition incorporate a non-uniform loop radius as a function of position along the central axis 156, similar to as described above in the example of FIG. 1. Thus, the magnetic solenoid 150 can be configured in any of a variety of ways.

Figure 7:
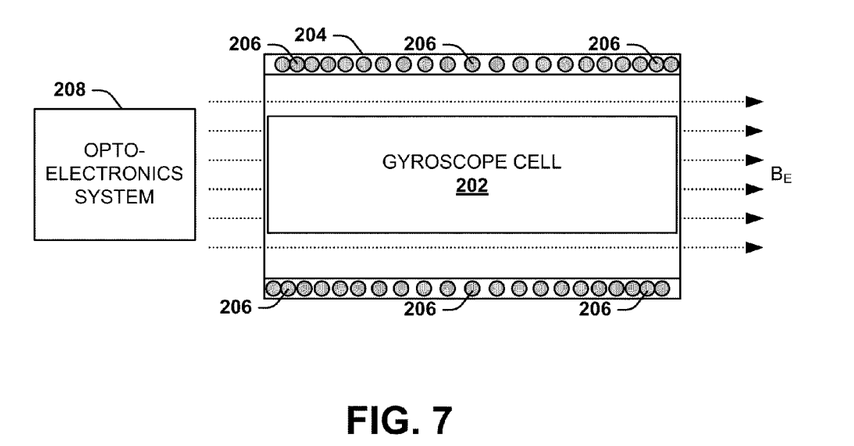
FIG. 7 illustrates another example of a gyroscope system in accordance with an aspect of the invention.

FIG. 7 illustrates another example of a gyroscope system 200 in accordance with an aspect of the invention. As an example, the gyroscope system 200 can be configured as a nuclear magnetic resonance (NMR) gyroscope system, such as to detect rotational motion about an axis. For example, the gyroscope system 200 can be one of a plurality of gyroscope systems, such as implemented in air or spacecraft, to detect yaw, pitch, and roll, respectively.

The gyroscope system 200 includes a gyroscope cell 202. The gyroscope cell 202 can include a glass case that can be filled with, for example, an alkali metal vapor and/or at least one noble gas isotope. In the example of FIG. 7, the gyroscope cell 202 is substantially enclosed in an inner volume of a magnetic solenoid 204. As an example, the magnetic solenoid 204 can be configured substantially similar to the magnetic solenoid 100 in the example of FIG. 5. Specifically, the magnetic solenoid 204 can have a conductive coil 206 that has a loop-spacing that is non-uniform along the length of the magnetic solenoid 204, such as defined by Equation 3 above. Therefore, the magnetic solenoid 204 can be configured to generate a substantially uniform magnetic field $B_E$ throughout the inner volume of the magnetic solenoid 204.

In response to the substantially uniform magnetic field $B_E$, the alkali metal vapor and the noble gas isotope(s), in the gyroscope cell 202 can precess relative to the axis of the gyroscope cell 202. The gyroscope system 200 also includes an opto-electronics system 208. The opto-electronics system 208 can be configured to optically pump the alkali metal vapor in the gyroscope cell 202 to align the spin of the alkali metal vapor with the applied magnetic field. In response, due to a spin-exchange process, any noble gas isotopes also present in the gyroscope cell 202 are also spin-aligned to the pump light beam. A detection beam of light with a directional component normal to the pump direction can be modulated in response to the alignment of the alkali metal vapor relative to the detection light. The modulation of the detection light can be a function of the precession of the alkali metal vapor as modified by the precession of any noble gas isotopes present. This modulation can be detected by a photodetector, such as included in the opto-electronics system 208. Accordingly, changes in the precession rates of the alkali metal vapor, and by extension any noble gas isotopes present, as detected by the modulated optical signal, can be detected and processed to determine changes in the orientation of the gyroscope cell 202 that correspond to rotational motion.

It is to be understood that the gyroscope system 200 is demonstrated simplistically. As such, additional components and details have been omitted from the example of FIG. 7 and the associated description. In addition, it is also to be understood that a magnetic solenoid such as the magnetic solenoid 100 in the example of FIG. 5 is not intended to be limited to use in a gyroscope system, such as the gyroscope system 200 in the example of FIG. 7. Therefore, the magnetic solenoid 100 can be implemented in any of a variety of applications that may require a magnetic field, particularly a substantially uniform magnetic field.

Figure 8:
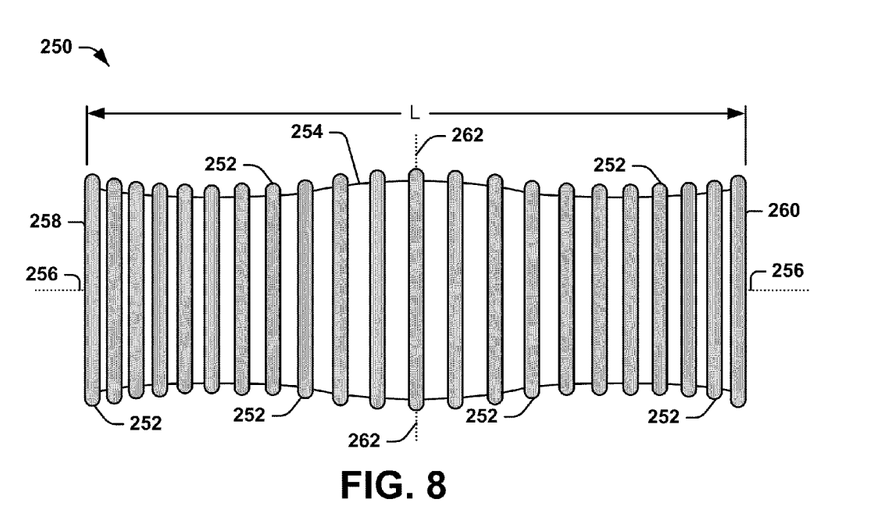
FIG. 8 yet a further example of a magnetic solenoid in accordance with an aspect of the invention.

FIG. 8 yet a further example of a magnetic solenoid 250 in accordance with an aspect of the invention. As an example, the magnetic solenoid 250 can be implemented in any of a variety of applications that utilize a magnetic field, such as in an NMR gyroscope application. In the example of FIG. 8, the magnetic solenoid 250 is demonstrated in a side view and includes a conductive coil 252 that is wound around a substantially cylindrical coil form 254 and is centered on a central axis 256. It is to be understood that, in the example of FIG. 8, the conductive coil 252 is illustrated in an exaggerated manner for ease in demonstration.

The magnetic solenoid 250 is configured to generate a substantially uniform magnetic field within an inner volume of the magnetic solenoid 250. In the example of FIG. 8, the radius of the conductive coil 252 wound around the coil form 254 can be defined by a compound equation at each point along the central axis 256 within the inner volume of the magnetic solenoid 250, such as to define a variable radius along a length L of the magnetic solenoid 250 between a first end 258 and a second end 260. As an example, the magnetic solenoid 250 can have a radius about a central axis that is defined by a compound equation. For example, the radius of the magnetic solenoid 250 can be defined by Equation 1 that includes a first operand that is a substantially circular or elliptical function and a second operand that is an exponential function (e.g., a polynomial), or by Equation 2 that includes a first operand that defines the radius at the center of the magnetic solenoid 250 and second and third operands that are each exponential functions.

In addition, the conductive coil 252 can have a loop-spacing that is non-uniform along the length L of the magnetic solenoid 250 between the first and second ends 258 and 260. In the example of FIG. 8, the loop-spacing of the conductive coil 252 has a substantially maximum value at an approximate center point of the central axis 256 along the length L of the magnetic solenoid 250 (i.e., approximately L/2), with the location of the center point being demonstrated based on an intersecting axis 262. The loop-spacing can thus decrease in value away from the center point, with substantially minimum values at each of the first and second ends 258 and 260.

In the example of FIG. 8, the loop-spacing is substantially symmetrical about the intersecting axis 262 with respect to the first and second ends 258 and 260. For example, the loop-spacing of the magnetic solenoid 250 can be defined by Equation 3, such as to define a distance of each loop of the conductive coil 252 relative to the intersecting axis 262. Therefore, based on the combination of the radius and the loop-spacing of the conductive coil 252, the magnetic solenoid 250 can be configured to generate a substantially uniform magnetic field within the inner volume of the magnetic solenoid 250.

Figure 9:
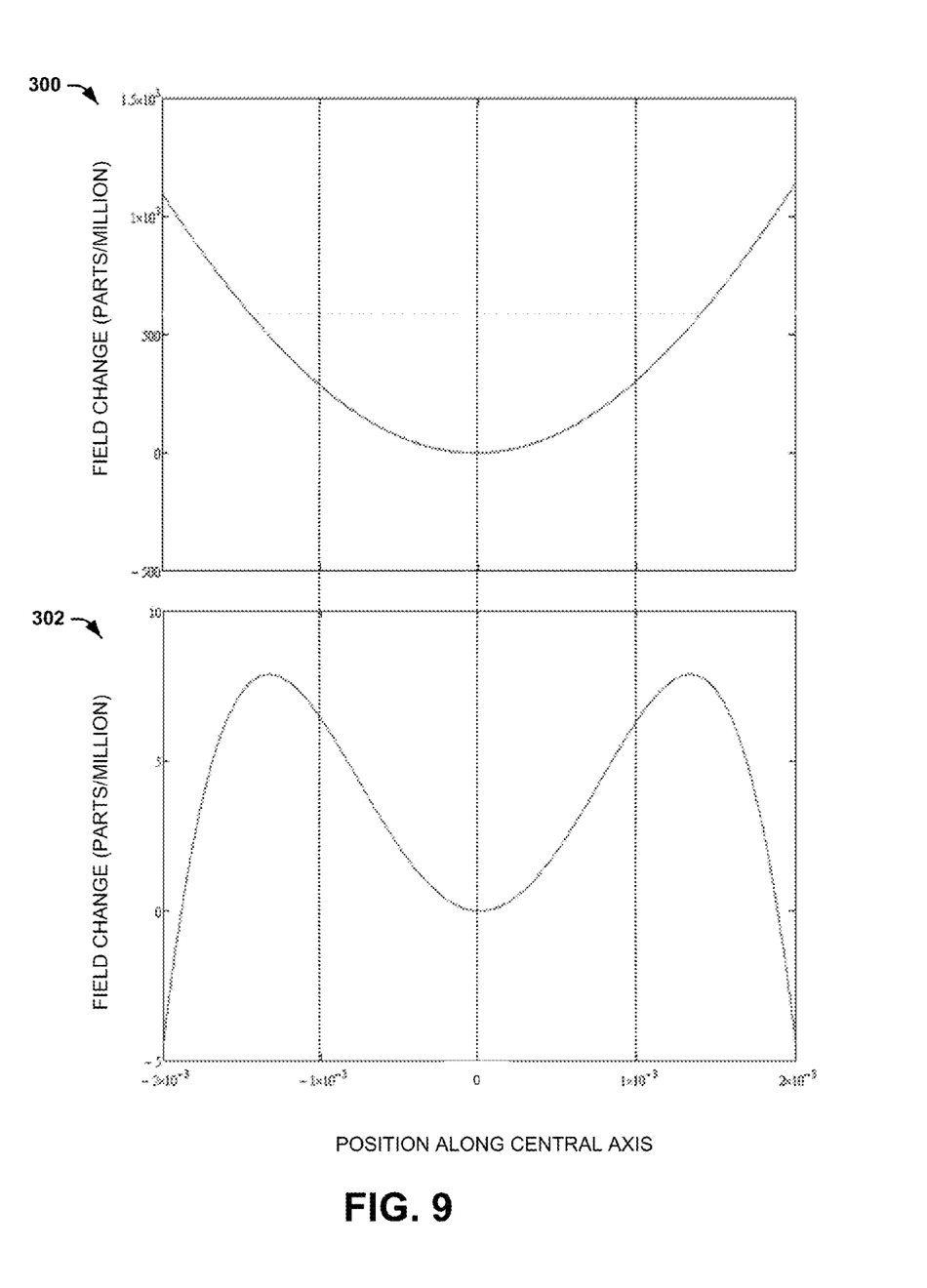
FIG. 9 illustrates an example of graphs demonstrating along-axis magnetic field in accordance with an aspect of the invention.

FIG. 9 illustrates an example of graphs 300 and 302 demonstrating along-axis magnetic field in accordance with an aspect of the invention. In the example of FIG. 9, the graph 300 can correspond to a typical, helically-wound square Helmholtz magnetic solenoid having a coil radius of approximately 20 mm and a spacing from the center of one set of loops to the center of the other set of loops of approximately 20 mm, such as resulting in a traditional, non-optimized Helmholtz configuration. The graph 302 can correspond to the magnetic solenoid 250 in the example of FIG. 8, such as based on Equations 1 and 3, having substantially similar dimensions as the typical, substantially cylindrical magnetic solenoid. For example, with respect to Equation 1, the magnetic solenoid 250 can have a MinorAxis value of approximately 39.9 mm, a MajorAxis value of approximately 40 mm, a Midpoint value of approximately 0 mm, and values for the constants A, B, and C of approximately $10^3$, $3.85 \times 10^7$, and 4, respectively. With respect to Equation 3, the magnetic solenoid 250 can have a value for the constant E of approximately 3.4, and can have a quantity N of loops that equals 20, such that D={−9.5, −8.5, −7.5, . . . , 8.5, 9.5}, respectively.

The graphs 300 and 302 plot changes in the magnetic field (Y-axis), in parts per million, versus distance along the central axis (X-axis) of the respective magnetic solenoids. As demonstrated by the graph 302, the magnetic solenoid 250 has significantly greater along-axis magnetic field uniformity than the typical, non-optimized Helmholtz configuration demonstrated by the graph 300. Specifically, the graph 300 demonstrates variation in the along-axis magnetic field for the typical, square Helmholtz magnetic solenoid of approximately 1100 parts per million relative to a variation of approximately 12 parts per million demonstrated by the graph 302 for the magnetic solenoid 250. Therefore, the magnetic solenoid 250 can exhibit superior along-axis magnetic field uniformity relative to a typical magnetic solenoid, including a typical square Helmholtz magnetic solenoid.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A magnetic solenoid comprising:
   an elongated sidewall that extends along and surrounds a central axis between spaced apart ends, the central axis comprising a center point that is approximately equidistant from the spaced apart ends;
   a conductive coil that extends along and conforms to the elongated sidewall and comprises a plurality of consecutive loops centered on the central axis, the plurality of consecutive loops having a loop-spacing that is non-uniform along the central axis and having a substantial maximum spacing value at approximately the center point; and
   at least one opening in the elongated sidewall between the spaced apart ends and between a consecutive pair of the plurality of consecutive loops.

2. The magnetic solenoid of claim 1, wherein the loop-spacing is substantially symmetrical about the center point of the central axis.

3. The magnetic solenoid of claim 2, wherein the loop-spacing has substantial minimum spacing values at approximately the spaced apart ends.

4. The magnetic solenoid of claim 1, wherein the loop-spacing is defined by an equation as follows:

$$Zc = \frac{\frac{|D|}{D} * \text{Length}}{2} * \frac{(D^2)^{1/E}}{\left(\left(\frac{N-1}{2}\right)^2\right)^{1/E}}$$

where:
   Zc is a distance from the center point of the central axis to a given one of the plurality of consecutive loops along the central axis;
   Length is a total length of the magnetic solenoid between the spaced apart ends;
   N is a total quantity of the plurality of consecutive loops;
   E is a constant defining exponential terms of the equation; and
   D is a loop number associated with the given one of the plurality of consecutive loops, defined by steps of one unit from $$-\left(\frac{N-1}{2}\right) \text{ to } \left(\frac{N-1}{2}\right).$$

5. The magnetic solenoid of claim 1, wherein the at least one opening is located at a position in the elongated sidewall such that a normal axis passes through the at least one opening, the normal axis being perpendicular to the central axis and bisecting the central axis with respect to the spaced apart ends.

6. The magnetic solenoid of claim 1, wherein the magnetic solenoid is configured to generate a substantially uniform magnetic field with respect to each point in three-dimensional space within an inner volume of the magnetic solenoid based at least in part on the loop-spacing.

7. The magnetic solenoid of claim 1, wherein the elongated sidewall has a radius that is defined by a compound equation that varies the radius as a function of position along the central axis.

8. The magnetic solenoid of claim 7, wherein the compound equation comprises a first operand that affects along-axis uniformity of the substantially uniform magnetic field and a second operand that affects off-axis uniformity of the substantially uniform magnetic field.

9. The magnetic solenoid of claim 7, wherein the compound equation comprises:
   a first operand that defines the radius at a midpoint of the magnetic solenoid along the central axis;
   a second operand that is an exponential function that is subtracted from first operand; and
   a third operand that is an exponential function that is added to the first operand, the second and third operands counteracting each other to vary the radius along a length of the magnetic solenoid from the midpoint.

10. A gyroscope system comprising the magnetic solenoid of claim 1, the gyroscope system comprising a gyroscope cell that is enclosed within an inner volume of the magnetic solenoid.

11. A magnetic solenoid comprising:
an elongated sidewall that extends along and surrounds a central axis between spaced apart ends, the central axis comprising a center point that is approximately equidistant from the spaced apart ends; and
a conductive coil that extends along and conforms to the elongated sidewall and comprises a plurality of consecutive loops centered on the central axis, the plurality of consecutive loops having a loop-spacing that is non-uniform along the central axis, the loop-spacing being substantially symmetrical about the center point of the central axis and having a substantial maximum spacing value at approximately the center point and substantial minimum spacing values at approximately the spaced apart ends, such that the magnetic solenoid is configured to generate a substantially uniform magnetic field with respect to each point in three-dimensional space within an inner volume of the magnetic solenoid based at least in part on the loop-spacing.

12. The magnetic solenoid of claim 11, wherein the loop-spacing is defined by an equation as follows:

$$Zc = \frac{\frac{|D|}{D}*\text{Length}}{2}*\frac{(D^2)^{1/E}}{\left(\left(\frac{N-1}{2}\right)^2\right)^{1/E}}$$

where:
Zc is a distance from the center point of the central axis to a given one of the plurality of consecutive loops along the central axis;
Length is a total length of the magnetic solenoid between the spaced apart ends;
N is a total quantity of the plurality of consecutive loops;
E is a constant defining exponential terms of the equation; and
D is a loop number associated with the given one of the plurality of consecutive loops, defined by steps of one unit from $$-\left(\frac{N-1}{2}\right) \text{ to } \left(\frac{N-1}{2}\right).$$

13. The magnetic solenoid of claim 11, further comprising at least one opening in the elongated sidewall between the spaced apart ends and between a consecutive pair of the plurality of consecutive loops.

14. The magnetic solenoid of claim 13, wherein the at least one opening is located at a position in the elongated sidewall such that a normal axis passes through the at least one opening, the normal axis being perpendicular to the central axis and bisecting the central axis with respect to the spaced apart ends.

15. A magnetic solenoid comprising:
an elongated sidewall that extends along and surrounds a central axis between spaced apart ends, the central axis comprising a center point that is approximately equidistant from the spaced apart ends, the elongated sidewall having a radius that is defined by a compound equation that varies the radius as a function of position along the central axis; and
a conductive coil that extends along and conforms to the elongated sidewall and comprises a plurality of consecutive loops centered on the central axis, the plurality of consecutive loops having a consecutive loop-spacing that is non-uniform along the central axis and having a substantial maximum spacing value at approximately the center point, the magnetic solenoid being configured to generate a substantially uniform magnetic field with respect to each point in three-dimensional space within an inner volume of the magnetic solenoid based on the consecutive loop-spacing and the geometry of the elongated sidewall.

16. The magnetic solenoid of claim 15, wherein the compound equation comprises a first operand that affects along-axis uniformity of the substantially uniform magnetic field and a second operand that affects off-axis uniformity of the substantially uniform magnetic field.

17. The magnetic solenoid of claim 16, wherein the first operand comprises a substantially elliptical function with respect to the radius along the central axis and having a minor axis bisected by the central axis, and wherein the second operand comprises an exponential function that causes the radius to flare outward from the central axis at the spaced apart ends.

18. The magnetic solenoid of claim 15, wherein the compound equation comprises:
a first operand that defines the radius at a midpoint of the magnetic solenoid along the central axis;
a second operand that is an exponential function that is subtracted from first operand; and
a third operand that is an exponential function that is added to the first operand, the second and third operands counteracting each other to vary the radius along a length of the magnetic solenoid from the midpoint.

19. The magnetic solenoid of claim 15, wherein the consecutive loop-spacing is substantially symmetrical about the center point of the central axis and has a substantial maximum spacing value at approximately the center point and substantial minimum spacing values at approximately the spaced apart ends.

* * * * *